United States Patent
Wang

(10) Patent No.: US 7,557,302 B2
(45) Date of Patent: Jul. 7, 2009

(54) PRINTED CIRCUIT BOARD WITH ELECTROSTATIC DISCHARGE DAMAGE PREVENTION

(75) Inventor: Yu-Xiang Wang, Shenzhen (CN)

(73) Assignees: Hong Fu Jin Precision Industry (ShenZhen) Co., Ltd., Shenzhen, Guangdong Province (CN); Hong Hai Precision Industry Co., Ltd., Tu-Cheng, Taipei Hsien (TW)

( * ) Notice: Subject to any disclaimer, the term of this patent is extended or adjusted under 35 U.S.C. 154(b) by 470 days.

(21) Appl. No.: 11/295,949

(22) Filed: Dec. 6, 2005

(65) Prior Publication Data

US 2006/0139894 A1 Jun. 29, 2006

(30) Foreign Application Priority Data

Dec. 24, 2004 (CN) .................. 2004 1 0091861

(51) Int. Cl.
*H01K 1/03* (2006.01)
(52) U.S. Cl. .................. 174/255; 174/78; 174/261; 174/266; 361/760; 361/761
(58) Field of Classification Search .................. 428/209; 174/250–255, 78, 261, 266; 361/760, 761
See application file for complete search history.

(56) References Cited

U.S. PATENT DOCUMENTS

| 6,002,569 | A | * | 12/1999 | Horvath | 361/111 |
| 6,064,094 | A | * | 5/2000 | Intrater et al. | 257/355 |
| 6,130,459 | A | * | 10/2000 | Intrater | 257/355 |
| 6,800,814 | B2 | * | 10/2004 | Ohsaka | 174/255 |
| 7,030,482 | B2 | * | 4/2006 | Haines | 257/706 |
| 7,064,471 | B2 | * | 6/2006 | Ikeda et al. | 310/313 D |

* cited by examiner

*Primary Examiner*—Cathy Lam

(57) ABSTRACT

A printed circuit board for preventing electrostatic discharge damage includes several electronic components thereon. The printed circuit board defines a number of through holes therein. The printed circuit board includes a signal layer. The signal layer defines a first copper foil and second copper foil thereon. The first copper foils are disposed around the corresponding through holes and connect with the through holes. The second copper foils are disposed around the first copper foils and extend to two adjacent edges of the printed circuit board. The first copper foil and the second copper foil have a number of saw teeth. A gap between the first copper foil and the second foil is in the range from 0.1-0.125 mm.

12 Claims, 3 Drawing Sheets

PRINTED CIRCUIT BOARD WITH ELECTROSTATIC DISCHARGE DAMAGE PREVENTION

CROSS-REFERENCE TO RELATED APPLICATION

Related subject matter is disclosed in co-pending U.S. patent application No. 11/295,944, filed on Dec 6, 2005 and entitled "PRINTED CIRCUIT BOARD WITH INSULATIVE AREA FOR ELECTROSTATIC DISCHARGE DAMAGE PREVENTION", which is assigned to the same assignee as that of the present application.

BACKGROUND

1. Field of the Invention

The present invention relates to a printed circuit board for preventing electrostatic discharge damage, and more particularly to a printed circuit board achieving this without the need for added materials.

2. General Background

In general, electronic products including printed circuit boards (PCBs) are susceptible to damage by electrostatic discharge during manufacturing, assembly, transportation and utilization. Therefore electrostatic discharge protection is necessary for electronic devices, especially printed circuit boards. The trend toward miniaturization of electronic components on printed circuit boards has lead to a reduction in compression and current surge resistance of electronic components. Therefore electrostatic fields and electrostatic currents from electrostatic discharges are more likely to damage precision electronic components on printed circuit boards. Damage resulting from an electrostatic discharge may impair the functioning of entire electronic devices.

Referring to FIG. 3 and FIG. 4, a conventional four-layer printed circuit board includes a signal layer 11, a power layer 15, a ground layer 17, and a plurality of electronic components 21. The printed circuit board defines a plurality of through holes 31 therein, and each through hole 31 has an electrical connection with the ground layer 17 through an inner wall of the through hole 31. Typically, the through holes 31 have metal coatings on the inner walls thereof. The electronic components 21 on the printed circuit board are connected to the ground layer 17 through pins and solder balls, so that the electronic components 21 can be grounded. The ground layer 17 can also provide EMI (Electro Magnetic Interference) shielding for the printed circuit board.

During the manufacture and assembly of printed circuit boards, electrical charges on the surface of an operator's body may be released through electrostatic discharge on contact with the printed circuit boards. The body of the operator commonly contacts an edge of the printed circuit board; therefore in general, the electrostatic discharge takes place on the edge of the printed circuit board. Because electrostatic current often discharges to the ground through a route which has a shortest distance and minimal impedance, the electrostatic current flows to the through holes 31 from the edge of the printed circuit board, and in doing so passes through one or more of the electronic components 21 on the printed circuit board. The electrostatic current may thereby damage the electronic components 21.

There are many means of preventing damage from electrostatic discharge on a printed circuit board. A common means is to design a protective circuit on the printed circuit board. However, in designing a protective circuit, each component's function and position on the printed circuit board should be considered. Additionally, a protective circuit requires additional electronic components and layout spaces on the printed circuit board. Furthermore, this kind of design is complex and increases the cost of manufacturing.

What is needed is a printed circuit board which can prevent damage due to electrostatic discharge without costly additions.

SUMMARY

An exemplary printed circuit board for preventing electrostatic discharge damage includes several electronic components thereon. The printed circuit board defines a plurality of through holes therein, and includes a signal layer. The signal layer defines a plurality of first copper foils and second copper foils thereon. Each first copper foil is disposed around a corresponding through hole and connects with an inner wall of the through hole. Each second copper foil is disposed around a corresponding first copper foil, and extends to two adjacent edges of the printed circuit board. The first copper foil and the second copper foil have a plurality of saw teeth facing each other across a gap therebetween. The gap between the first copper foil and the second foil is in the range from 0.1-0.125 mm.

When electrostatic discharge takes place due to an operator's touching of the printed circuit board, the electrostatic current is released to the saw teeth of the first copper foil and then grounded through the through hole. Thus the electronic components on the printed circuit board are protected from electrostatic discharge.

Other advantages and novel features will become more apparent from the following detailed description when taken in conjunction with the accompanying drawings, in which:

DETAILED DESCRIPTION OF THE EMBODIMENTS

Figure 1:
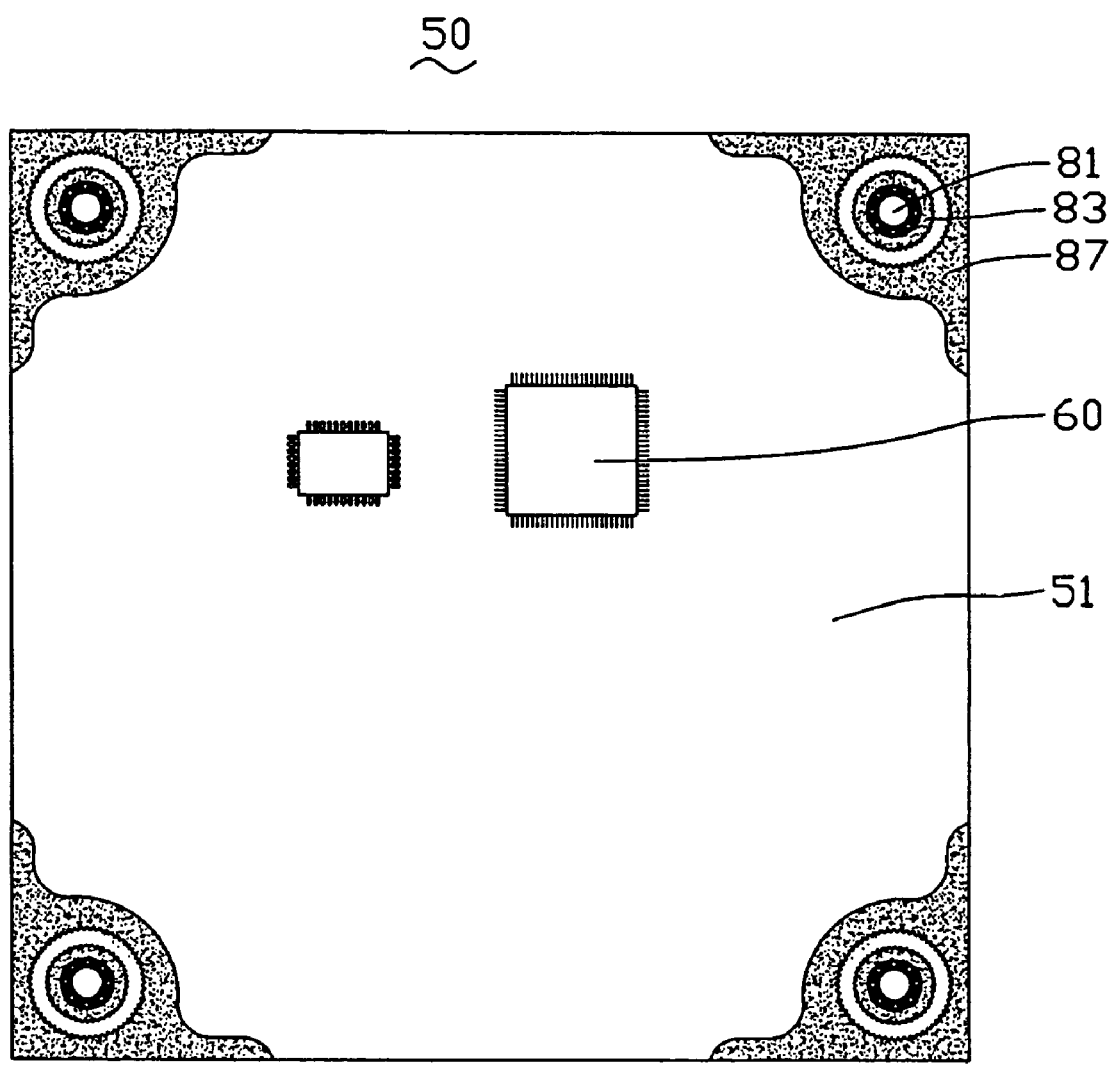
FIG. 1 is a top plan view of a printed circuit board in accordance with a preferred embodiment of the present invention, showing the structure of a signal layer thereof and a layout of electronic components thereon.
Figure 2:
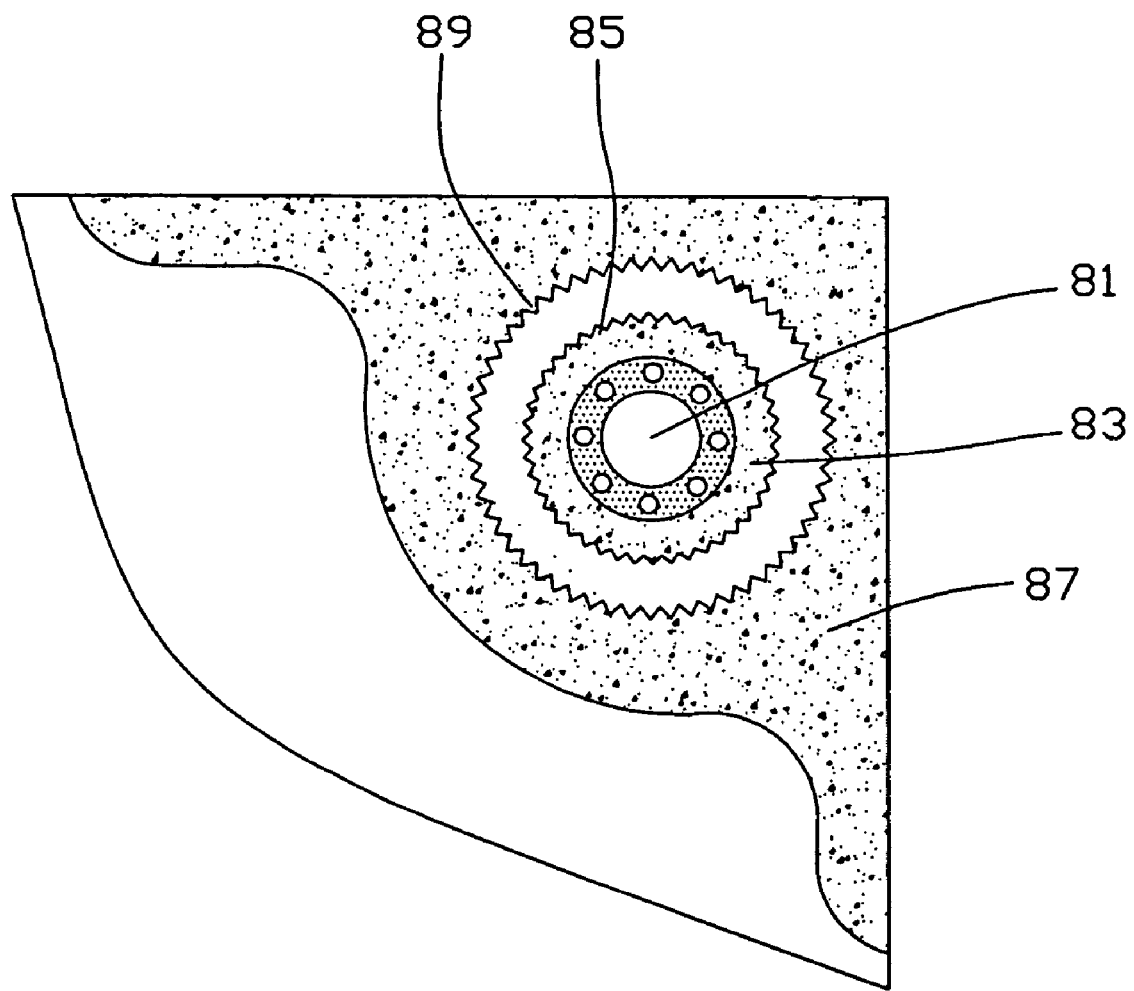
FIG. 2 is an enlarged view of one corner of the signal layer of the printed circuit board of FIG. 1.
Figure 3:
FIG. 3 is a cross-sectional view of part of a conventional four-layer printed circuit board including a signal layer.
Figure 4:
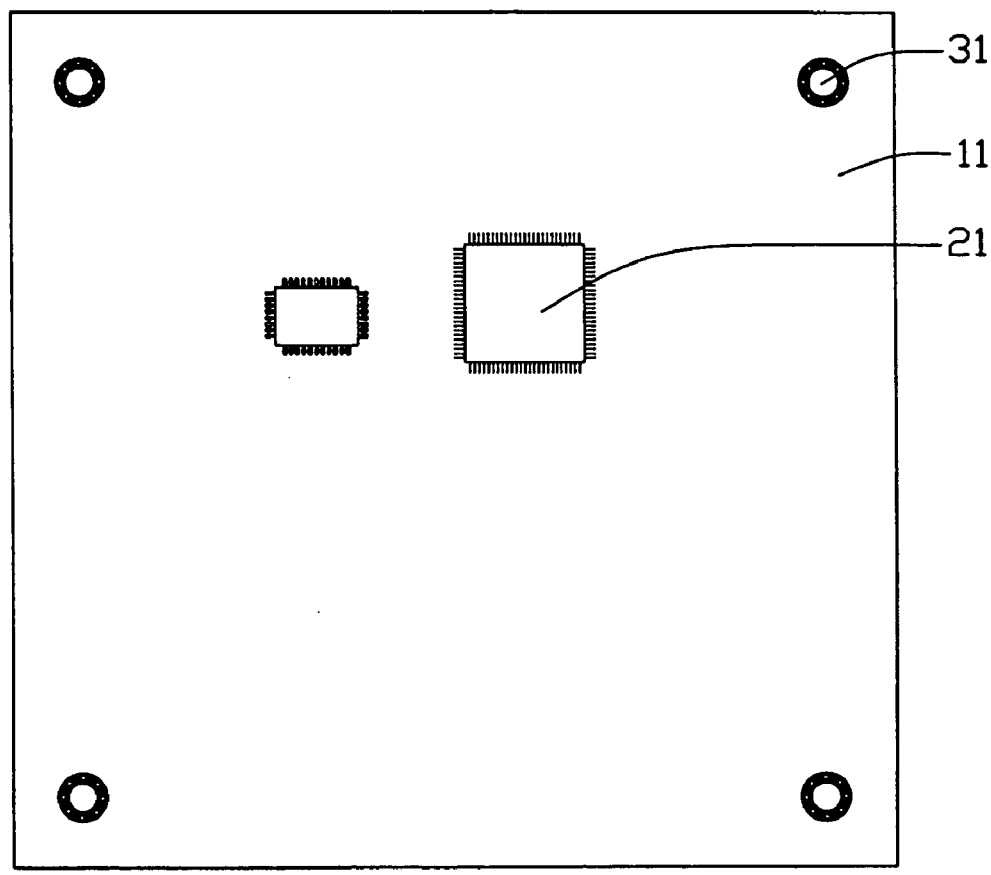
FIG. 4 is a top plan view of the printed circuit board of FIG. 3, showing the signal layer together with electronic components and through holes thereat.

Referring to FIG. 1 and FIG. 2, a printed circuit board 50 in accordance with a preferred embodiment of the present invention is shown. The printed circuit board 50 includes a signal layer 51 on one main side thereof. The printed circuit board 50 defines four through holes 81 in four corners thereof, respectively. A plurality of electronic components 60 is installed on a central region of the printed circuit board 50. A first copper foil 83 and a second copper foil 87, together defining a low-impedance protective area, are arranged on each corner of the signal layer 51. The first copper foil 83 is disposed around a corresponding through hole 81, and connects with an inner wall of the through hole 81. Typically, the through holes 81 have metal coatings on the inner wall thereof. The first copper foil 83 has a plurality of tips 85 on an outer edge thereof. In the illustrated embodiment, the tips 85 are continuous series of outer saw teeth. The second copper foil 87 lies around the first copper foil 83 without contacting it, and extends to two adjacent edges of the printed circuit board 50. The second copper foil 87 has a plurality of tips 89 on an inner edge thereof, the tips 89 facing the tips 85 of the first copper foil 83 across a gap therebetween. In the illustrated embodiment, the tips 89 are continuous series of inner saw teeth. The gap between the first copper foil 83 and the second copper foil 87 is in the range from 0.1-0.125 mm.

When an operator touches the printed circuit board 50, electrostatic discharge may occur at the second copper foil 87 because the second copper foil 87 extends to the edges of the printed circuit board 50 and has a very low impedance in comparison with the components 60. If electrostatic discharge occurs, according to the point discharge principle, electrostatic charges accumulate at the tips 89. When a threshold amount of electrostatic charges accumulate at the tips 89, the electrostatic charges are released to the tips 85 of the first copper foil 83 and then released to ground via the through holes 81. Thus, the electronic components 60 on the printed circuit board 50 are protected from damage due to electrostatic discharge. The printed circuit board 50 can prevent damage due to electrostatic discharge without costly additions. The principles of the present invention can be applied to a four-layer printed circuit board and also a six-layer printed circuit board.

It is believed that the present embodiments and their advantages will be understood from the foregoing description, and it will be apparent that various changes may be made thereto without departing from the spirit and scope of the invention or sacrificing all of its material advantages, the examples hereinbefore described merely being a preferred or exemplary embodiments.

What is claimed is:

1. A printed circuit board for preventing electrostatic discharge damage to one or more electronic components arranged thereon, the printed circuit board comprising:
    at least one through hole; and
    a signal layer comprising:
    at least one first copper portion surrounding and connecting with a wall of the through hole, the first copper portion including a plurality of saw teeth; and
    at least one second copper portion extending to one or both of adjacent edges of the printed circuit board and comprising a plurality of saw teeth, the second copper portion surrounding but not in contact with the first copper portion.

2. The printed circuit board as claimed in claim 1, wherein the signal layer lies on one side of the printed circuit board.

3. The printed circuit board as claimed in claim 1, wherein a gap between the first copper portion and the second copper portion is in a range from 0.1-0.125 mm.

4. The printed circuit board as claimed in claim 1, wherein the first copper portion and the second copper portion are copper foils.

5. A printed circuit board for preventing electrostatic discharge damage to electronic components arranged thereon, the printed circuit board comprising:
    a plurality of through holes; and
    a signal layer comprising:
    a central area for accommodating the electronic components;
    a plurality of first copper portions surrounding and connecting with walls of respective through holes, each first copper portion comprising continuous outer saw teeth; and continuous outer saw teeth; and
    a plurality of second copper portions surrounding but not contacting the corresponding first copper portions, each second copper portion comprising continuous inner saw teeth pointing towards the continuous outer saw teeth of the corresponding first copper portion.

6. The printed circuit board as claimed in claim 5, wherein the signal layer lies on one side of the printed circuit board.

7. The printed circuit board as claimed in claim 5, wherein a gap between each of the first copper portions and the corresponding second copper portion is in a range from 0.1-0.125 mm.

8. The printed circuit board as claimed in claim 5, wherein the first copper portions and the second copper portions are copper foils.

9. A circuit board capable of preventing components thereof from electrostatic discharge damage, comprising:
    an occupied area of said circuit board available to install components of said circuit board therein; and
    a protective area defined beside said occupied area and having significantly low impedance in comparison with impedance of said components of said circuit board, said protective area comprising first and second tips spaced from and facing each other for triggering electrostatic discharge applying onto said protective area therebetween instead of between said components, and capable of grounding said electrostatic discharge thereafter.

10. The circuit board as claimed in claim 9, wherein said protective area comprises a first copper portion and a second copper portion which is spaced from said first copper portion and capable of grounding.

11. The circuit board as claimed in claim 10, wherein said first tips are formed at a side of the first copper portion and pointing toward said second copper portion.

12. The circuit board as claimed in claim 10, wherein said second tips are formed at a side of the second copper portion and pointing toward said first copper portion.

* * * * *